(12) United States Patent
Cho

(10) Patent No.: US 11,093,325 B2
(45) Date of Patent: Aug. 17, 2021

(54) CONTROLLER, MEMORY SYSTEM INCLUDING THE SAME, AND METHOD OF OPERATING MEMORY SYSTEM

(71) Applicant: SK hynix Inc., Gyeonggi-do (KR)

(72) Inventor: Chan Hyeok Cho, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 27 days.

(21) Appl. No.: 16/586,436

(22) Filed: Sep. 27, 2019

(65) Prior Publication Data

US 2020/0310912 A1 Oct. 1, 2020

(30) Foreign Application Priority Data

Mar. 26, 2019 (KR) .................. 10-2019-0034676

(51) Int. Cl.
| | | |
|---|---|---|
| *G06F 11/10* | (2006.01) | |
| *G11C 16/04* | (2006.01) | |
| *G11C 16/26* | (2006.01) | |
| *G11C 16/34* | (2006.01) | |
| *G06F 12/10* | (2016.01) | |
| *G11C 16/10* | (2006.01) | |
| *G11C 11/56* | (2006.01) | |

(52) U.S. Cl.
CPC .......... *G06F 11/1068* (2013.01); *G06F 12/10* (2013.01); *G11C 16/0483* (2013.01); *G11C 16/10* (2013.01); *G11C 16/26* (2013.01); *G11C 16/349* (2013.01); *G06F 2212/7201* (2013.01); *G11C 11/5671* (2013.01)

(58) Field of Classification Search
CPC .................................................. G06F 11/1068
USPC .................................. 714/764, 768, 770, 763
See application file for complete search history.

(56) References Cited

U.S. PATENT DOCUMENTS

| | | | | |
|---|---|---|---|---|
| 2014/0211565 A1* | 7/2014 | Song | ...................... | G11C 16/14 |
| | | | | 365/185.03 |
| 2019/0102088 A1* | 4/2019 | Fang | ................... | G06F 11/1004 |
| 2019/0371418 A1* | 12/2019 | Kim | ...................... | G11C 29/44 |
| 2020/0176045 A1* | 6/2020 | Jung | ................... | G06F 11/1012 |

FOREIGN PATENT DOCUMENTS

| | | |
|---|---|---|
| KR | 10-2010-0138544 | 12/2010 |
| KR | 10-2015-0019722 | 2/2015 |
| KR | 10-1824068 | 3/2018 |

* cited by examiner

*Primary Examiner* — Fritz Alphonse
(74) *Attorney, Agent, or Firm* — IP & T Group LLP

(57) ABSTRACT

Provided herein may be a controller, a memory system including the controller, and a method of operating the memory system. The controller may include a processor configured to control a read operation of a memory device in response to a read command received from a host and an error correction circuit configured to perform an error correction operation on read data received from the memory device during the read operation. The processor may determine deterioration characteristics of the memory device during the read operation, and control the memory device to select and perform any one of a re-program operation and a reclaim operation on memory cells on which the read operation has been performed.

17 Claims, 10 Drawing Sheets

CONTROLLER, MEMORY SYSTEM INCLUDING THE SAME, AND METHOD OF OPERATING MEMORY SYSTEM

CROSS-REFERENCE TO RELATED APPLICATION

The present application claims priority under 35 U.S.C. § 119(a) to Korean patent application number 10-2019-0034676, filed on Mar. 26, 2019, which is incorporated herein by reference in its entirety.

BACKGROUND

Field of Invention

Various embodiments of the present disclosure generally relate to an electronic device, and, more particularly, to a controller, a memory system including the controller, and a method of operating the memory system.

Description of Related Art

Recently, the paradigm for the computer environment has been converted into ubiquitous computing so that computer systems can be used anytime and anywhere. As a result, the use of portable electronic devices such as mobile phones, digital cameras, and notebook computers has rapidly increased. Generally, portable electronic devices use a memory system which employs a memory device, for storing data, i.e., as use a data storage device. The memory device may be used as a main memory device or an auxiliary memory device for a portable electronic device.

A memory system using a memory device provides advantages in that, since there is no mechanical driving part, stability and durability are excellent, an information access speed is increased, and power consumption is reduced. Examples of memory systems having such advantages, may include a universal serial bus (USB) memory device, a memory card having various interfaces, a solid state drive (SSD), and the like.

Memory devices may be classified into volatile memory devices and nonvolatile memory devices.

A nonvolatile memory device, although having comparatively low read and write speeds, may retain data stored therein even when the power supply is interrupted. Therefore, the nonvolatile memory device is used when there is a need for storing data which is required to be retained regardless of whether or not the nonvolatile memory device is connected to a power supply. Representative examples of the nonvolatile memory device may include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM). The flash memory is classified into a NOR type memory and a NAND type memory.

SUMMARY

Various embodiments of the present disclosure are directed to a controller capable of determining threshold voltage distribution characteristics of memory cells during a read operation and performing a retention characteristic improvement operation. Various embodiments of the present disclosure are also directed to a memory system including the controller, and a method of operating the memory system.

An embodiment of the present disclosure may provide for a controller including: a processor configured to control a read operation of a memory device in response to a read command received from a host; and an error correction circuit configured to perform an error correction operation on read data received from the memory device during the read operation. The processor may determine deterioration characteristics of the memory device during the read operation, and control the memory device to select and perform any one of a re-program operation and a reclaim operation on memory cells on which the read operation has been performed.

Another embodiment of the present disclosure may provide for a memory system including: a memory device including a plurality of data-programmed memory cells; and a controller configured to control the memory device to perform a read operation on the plurality of memory cells in response to a read command received from a host. When a failure occurs during the read operation, the controller may determine deterioration characteristics for the plurality of memory cells, and control the memory device to perform a re-program operation or a reclaim operation on the plurality of memory cells.

Yet another embodiment of the present disclosure may provide for a method of operating a memory system, the method including: performing a first read operation on memory cells included in a memory device using reference read voltages and read retry voltages; performing, a second read operation on the memory cells using optimal read voltages when a result of the first read operation indicates that a failure has occurred; determining deterioration characteristics of the memory cells by comparing the reference read voltages and the optimal read voltages; and selecting and performing any one of a re-program operation and a reclaim operation on the memory cells based on the determined deterioration characteristics.

Yet another embodiment of the present disclosure may provide for a method of operating a memory system, the method including: controlling the memory device to perform a first read operation to a memory region with a reference read voltage; controlling the memory device to perform a second read operation to the memory region with an optimal read voltage when the first read operation fails due to an error of data read from the memory region; and controlling, the memory device to perform a re-program operation to the memory region when discrepancy between the reference read voltage and the optimal read voltage is greater for a first program status than for a second program status, wherein the first program status is more significant program status than the second program status.

These and other advantages and features of the present invention will be better understood by those with ordinary skill in the art to which the present invention belongs or pertains by the following detailed description of specific embodiments in conjunction with the following figures.

DETAILED DESCRIPTION

Figure 1:
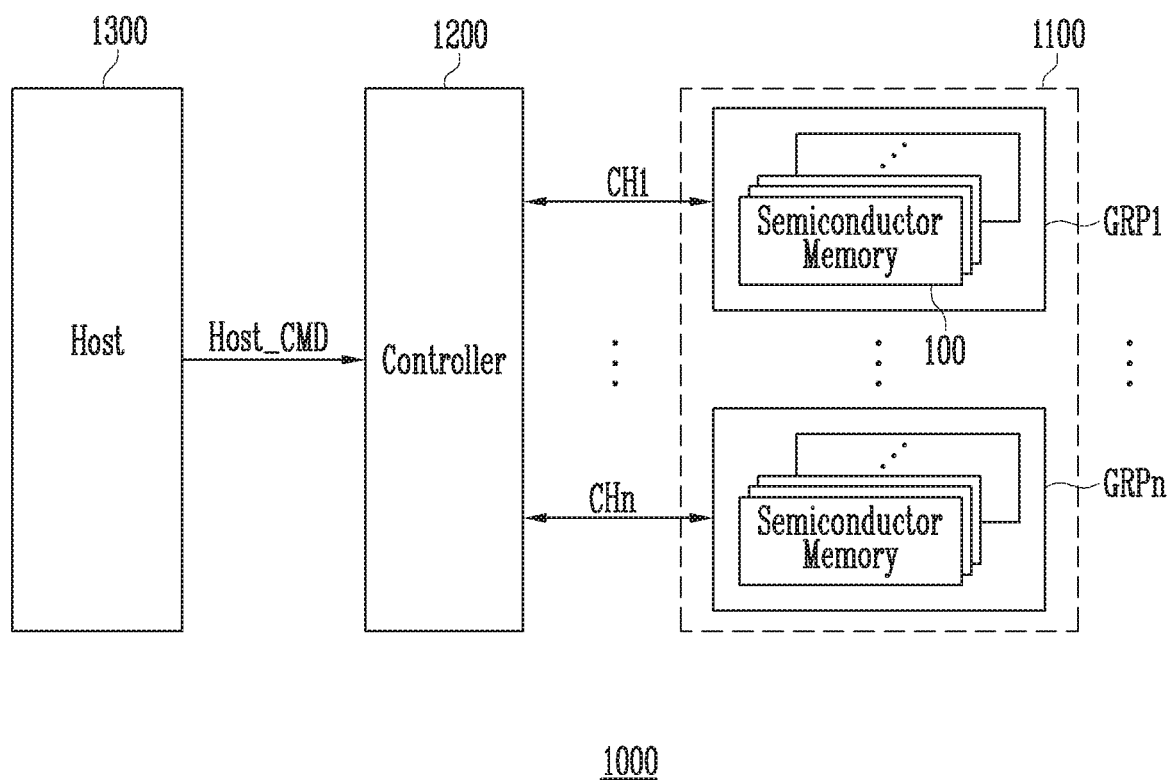
FIG. 1 is a block diagram illustrating a memory system in accordance with an embodiment of the present disclosure.

It is noted that specific structural or functional descriptions in the embodiments of the present disclosure introduced in this specification or application are only for description of the embodiments of the present disclosure. Moreover, the descriptions should not be construed as being limited to the embodiments described in the specification or application.

The present disclosure will now be described in detail based on specific embodiments by referring to the drawings. The present disclosure may, however, be embodied in many different forms and should not be construed as being limited to only the embodiments set forth herein, but should be construed as covering modifications, equivalents or alternatives falling within the inventive concepts and technical scope of the present invention disclosure.

It will be further understood that, although the terms "first", "second", etc. may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that describe the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, integers, steps, operations, elements, components, and/or combinations thereof but do not preclude the presence or addition of one or more other features, integers, steps, operations, elements, components, and/or combinations thereof.

Unless otherwise defined, all terms including technical and scientific terms used herein have the same meaning as commonly understood by one of ordinary skill in the art to which the present disclosure belongs in view of the present disclosure. It will be further understood that terms used herein should be interpreted as having a meaning that is consistent with their meaning in the context of this specification and the relevant art, and should not be interpreted in an idealized or overly formal sense unless expressly so defined herein.

Detailed description of functions and structures well known to those skilled in the art will be omitted to avoid obscuring the subject matter of the present disclosure. This aims to omit unnecessary description so as to make the subject matter of the present disclosure clear.

Various embodiments of the present disclosure will now be described more fully hereinafter with reference to the accompanying drawings, in which preferred embodiments of the present disclosure are shown, so that those of ordinary skill in the art can carry out the technical idea of the present disclosure without undue experimentation.

FIG. 1 is a block diagram illustrating a memory system 1000 in accordance with an embodiment of the present disclosure.

Referring to FIG. 1, the memory system 1000 may include a memory device 1100, a controller 1200, and a host 1300. The memory device 1100 may include a plurality of semiconductor memories 100. The plurality of semiconductor memories 100 may be divided into a plurality of groups GRP1 to GRPn. Although in the present embodiment the host 1300 has been illustrated and described as being included in the memory system 1000, the memory system 1000 may include only the controller 1200 and the memory device 1100, and the host 1300 may be disposed outside the memory system 1000.

In FIG. 1, it is illustrated that the plurality of groups of the memory device 1100 communicate with the controller 1200 through first n-th channels CH1 to CHn, respectively. Each semiconductor memory 100 will be described below with reference to FIG. 4.

Each of the plurality of groups of semiconductor memories 100 may communicate with the controller 1200 through one common channel. The controller 1200 may control the plurality of semiconductor memories 100 of the memory device 1100 through the plurality of channels CH1 to CHn.

The controller 1200 may be coupled between the host 1300 and the memory device 1100. In operation, the controller 1200 may access the memory device 1100 in response to a request received from the host 1300. For example, the controller 1200 may control a read operation, a write operation, an erase operation, or a background operation of the memory device 1100 in response to a host command Host_CMD received from the host 1300. During a write operation, the host 1300 may transmit data and an address along with a host command Host_CMD. During a read operation, the host 1300 may transmit an address along with a host command Host_CMD. The controller 1200 may provide an interface between the memory device 1100 and the host 1300. The controller 1200 may run firmware for controlling the memory device 1100.

The controller 1200 may control a read operation of the memory device 1100 in response to a host command Host_CMD which is received from the host 1300 and corresponds to a read operation. The controller 1200 may determine, based on a result of the read operation, deterioration characteristics of memory cells on which the read operation has been performed. The controller 1200 may perform a re-program algorithm or a reclaim algorithm to improve retention characteristics of the memory cells, based on a result of the determination. For example, during a read operation, if the threshold voltage distributions of some programmed statuses having relatively high threshold voltage values deteriorate more than the threshold voltage distributions of other programmed statuses among a plurality of programmed statuses of the memory cells, the controller 1200 may determine that the retention characteristics of the memory cells are deteriorated due to low temperature data retention (LTDR), and perform a re-program algorithm to improve the retention characteristics of the memory cells. Furthermore, during a read operation, if a plurality of programmed statuses of the memory cells deteriorate uniformly, the controller 1200 may determine that the retention characteristics of the memory cells are deteriorated due to other reasons than the low temperature data retention (LTDR), and perform a reclaim algorithm to improve the retention characteristics of the memory cells.

The host 1300 may include a portable electronic device such as a computer, a personal digital assistant (PDA), a portable multimedia player (PMP), an MP3 player, a camera, a camcorder, or a mobile phone. The host 1300 may use a host command Host_CMD to make a request for a write operation, a read operation, an erase operation, etc. of the memory system 1000. To perform a write operation of the memory device 1100, the host 1300 may transmit a host command Host_CMD corresponding to a write command, data, and an address to the controller 1200. To perform a read operation, the host 1300 may transmit a host command Host_CMD corresponding to a read command, and an address to the controller 1200. For example, addresses may be logical addresses.

The controller 1200 and the memory device 1100 may be integrated into a single semiconductor device. In an embodiment, the controller 1200 and the memory device 1100 may be integrated into a single semiconductor device to form a memory card. For example, the controller 1200 and the memory device 1100 may be integrated into a single semiconductor device and form a memory card such as a personal computer memory card international association (PCM-CIA), a compact flash card (CF), a smart media card (SM or SMC), a memory stick multimedia card (MMC, RS-MMC, or MMCmicro), a SD card (SD, miniSD, microSD, or SDHC), or a universal flash storage (UFS).

The controller 1200 and the memory device 1100 may be integrated into a single semiconductor device to form a solid state drive (SSD). The SSD may include a storage device configured to store data in a semiconductor memory 100.

In an embodiment, the memory system 1000 may be provided as one of various elements of an electronic device such as a computer, an ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an embodiment, the memory device 1100 or the memory system 1000 may be embedded in various types of packages. For example, the memory device 1100 or the memory system 1000 may be packaged in a package type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), or Wafer-Level Processed Stack Package (WSP).

Figure 2:
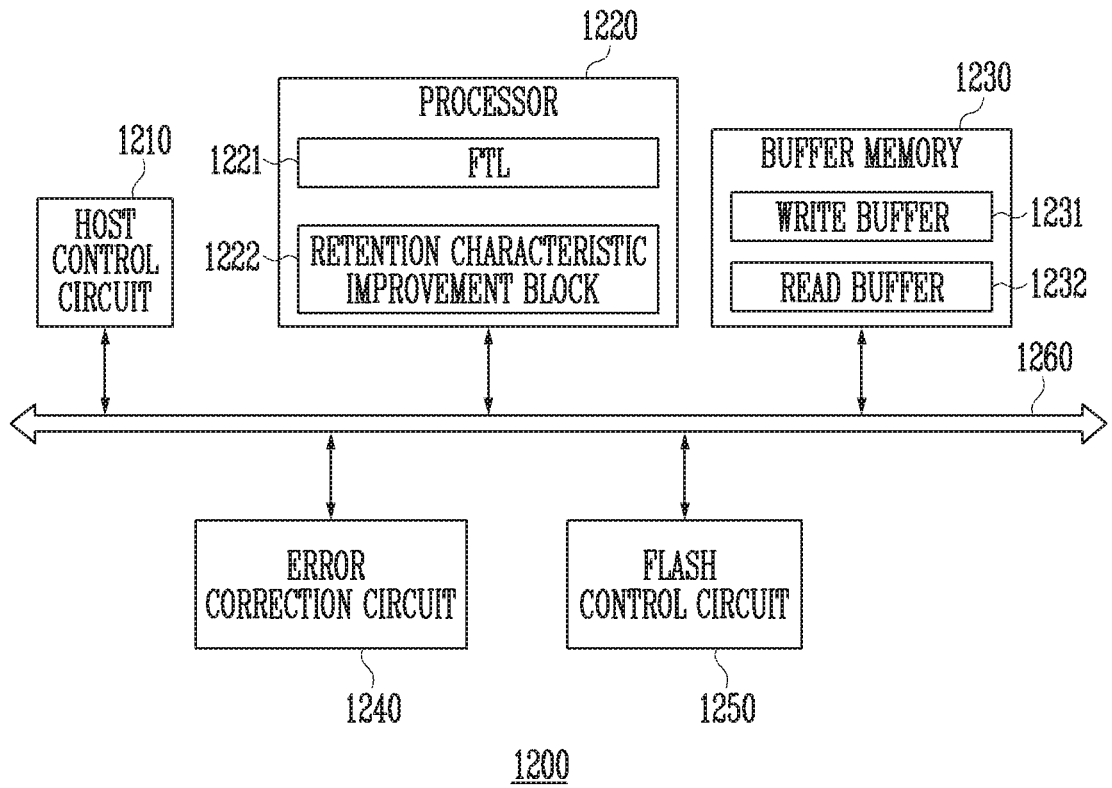
FIG. 2 is a block diagram illustrating a configuration of a controller of FIG. 1 in accordance with an embodiment of the present disclosure.

FIG. 2 is a diagram illustrating a configuration of the controller 1200 of FIG. 1 in accordance with an embodiment of the present disclosure.

Referring to FIG. 2, the controller 1200 may include a host control circuit 1210, a processor 1220, a buffer memory 1230, an error correction circuit 1240, a flash control circuit 1250, and a bus 1260.

The bus 1260 may provide a channel between the components of the controller 1200.

The host control circuit 1210 may control data transmission between the host 1300 of FIG. 1 and the buffer memory 1230. For example, the host control circuit 1210 may control an operation of buffering a data input from the host 1300 to the buffer memory 1230. In an embodiment, the host control circuit 1210 may control an operation of outputting data which have been buffered in the buffer memory 1230 to the host 1300.

The host control circuit 1210 may include a host interface.

The processor 1220 may control the overall operation of the controller 1200 and perform a logical operation. The processor 1220 may communicate with the host 1300 of FIG. 1 through the host control circuit 1210, and communicate with the memory device 1100 of FIG. 1 through the flash control circuit 1250. The processor 1220 may control the operation of the memory system 1000 by using the buffer memory 1230 as an operation memory, a cache memory, or a buffer. The processor 1220 may rearrange, based on priorities, a plurality of host commands received from the host 1300 and generate a command queue, and may control the flash control circuit 1250 based on the command queue. Furthermore, the processor 1220 may control the memory device 1100 and the error correction circuit 1240 to perform a read retry operation, an eBoost operation, or a soft decoding operation based on a result of an error correction operation on data read during a read operation. In addition, the processor 1220 may determine, during a read operation, deterioration characteristics of memory cells on which the read operation has been performed, and control the memory device 1100 to selectively perform any one of a re-program operation and a reclaim operation for improving the retention characteristics of the memory cells based on the determined deterioration characteristics.

The processor 1220 may include a flash translation layer (hereinafter, referred to as "FTL") 1221, and a retention characteristic improvement block 1222.

The FTL 1221 may be stored in the buffer memory 1230, an additional memory (not illustrated) directly coupled to the processor 1220, or a storage space defined in the processor 1220. During a read operation, the FTL 1221 may check a physical address mapped to a logical address input from the host 1300.

During a read operation, the FTL 1221 may generate a command queue for controlling the flash control circuit 1250 in response to a host command received from the host 1300. Furthermore, during a read operation, the FTL 1221 may control the memory device 1100 and the error correction circuit 1240 to perform a read retry operation, an eBoost operation, or a soft decoding operation if a failure has occurred as a result of an error correction operation on data read from the memory device 1100 during a read operation.

In the case where an eBoost operation or a soft decoding operation has been performed because a failure has occurred during a read operation, the retention characteristic improvement block 1222 may control the memory device 1100 to check deterioration characteristics of memory cells during the eBoost operation or the soft decoding operation and perform a re-program operation or a reclaim operation. The re-program operation may perform a program operation on a selected memory block during a read operation and raising, to a normal range, a threshold voltage distribution of memory cells that has been reduced below the normal range, so as to improve the retention characteristics of the memory cells. The reclaim operation may read data programmed in a selected memory block during a read operation, and programming the read data to another memory block, i.e., a memory block having an erased status, so as to improve the retention characteristics of the memory blocks.

The buffer memory 1230 may be used as an operation memory, a cache memory, or a buffer of the processor 1220. The buffer memory 1230 may store codes and commands to be executed by the processor 1220. The buffer memory 1230 may store data that is processed by the processor 1220.

The buffer memory 1230 may include a write buffer 1231 and a read buffer 1232. The write buffer 1231 may temporarily store data received from the host 1300 during a write operation, and then transmit the temporarily stored data to the memory device 1100 when an internal command corresponding to the write operation is transmitted to the memory device 1100. During a read operation, the read buffer 1232 may temporarily store data received from the memory device 1100, and then transmit the temporarily stored data to the host 1300.

The buffer memory 1230 may include a static RAM (SRAM) or a dynamic RAM (DRAM).

The error correction circuit 1240 may perform an error correction operation. The error correction circuit 1240 may perform an ECC (error correction code) encoding operation based on data to be written to the memory device 1100 of FIG. 1 through the flash control circuit 1250. ECC encoded data may be transmitted to the memory device 1100 through the flash control circuit 1250. The error correction circuit 1240 may perform an ECC decoding operation for data received from the memory device 1100 through the flash control circuit 1250. Error corrected data may be transmitted to the read buffer 1232 of the buffer memory 1230. Furthermore, the error correction circuit 1240 may transmit, if an error correction operation has failed, a signal indicating a failure to the processor 1220. Error corrected data may be transmitted to the read buffer 1232 of the buffer memory 1230.

It is noted, that although in FIG. 2 the error correction circuit 1240 and the flash control circuit 1250 are shown as being separate circuits, in another embodiment, the error correction circuit 1240 may be included in the flash control circuit 1250 as a component of the flash control circuit 1250.

The flash control circuit 1250 may generate and output an internal command for controlling the memory device 1100 in response to a command queue generated from the processor 1220. During a write operation, the flash control circuit 1250 may control an operation of transmitting and writing data buffered in the write buffer 1232 of the buffer memory 1230 to the memory device 1100. In an embodiment, during a read operation, in response to a command queue, the flash control circuit 1250 may control an operation of buffering data read from the memory device 1100 in the read buffer 1230 of the buffer memory 1232.

The flash control circuit 1250 may include a flash interface for interfacing with the memory device 1100.

Figure 3:
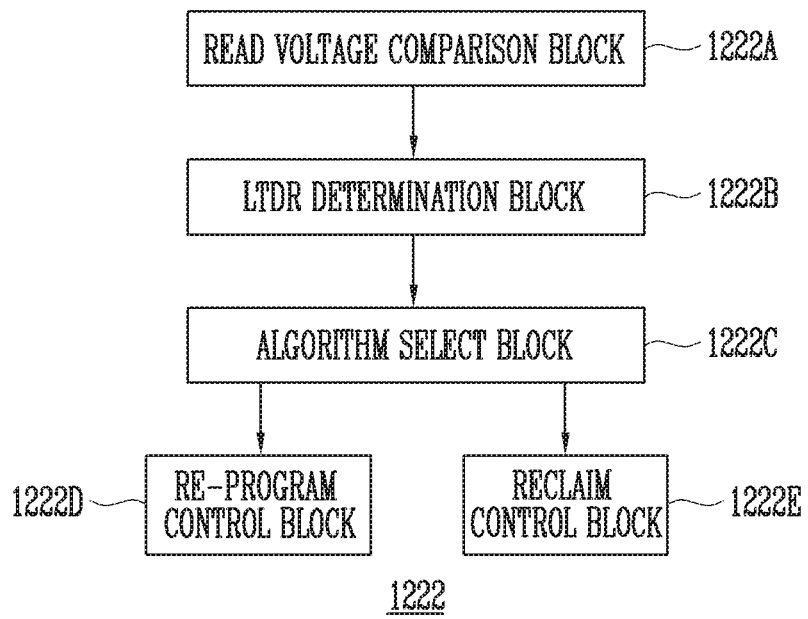
FIG. 3 is a block diagram illustrating a retention characteristic improvement block of the controller of FIG. 2 in accordance with an embodiment of the present disclosure.

FIG. 3 is a block diagram illustrating a configuration of the retention characteristic improvement block 1222 of FIG. 2 in accordance with an embodiment of the present disclosure.

Referring to FIG. 3, the retention characteristic improvement block 1222 may include a read voltage comparison block 1222A, an LTDR determination block 1222B, an algorithm select block 1222C, a re-program control block 1222D, and a reclaim control block 1222E.

The read voltage comparison block 1222A may compare optimal read voltages set during an eBoost operation or a soft decoding operation with reference read voltages for identifying or detecting a plurality of programmed statuses. In an embodiment, the reference read voltages may be read voltages for identifying or detecting respective ideal programmed statuses. For example, the reference read voltages may be initially-set read voltages of the memory device. The optimal read voltages may be read voltages of a read operation generating no error bit or only a minimum error bit during an eBoost operation or a soft decoding operation.

The read voltage comparison block 1222A may detect read voltage difference values corresponding to respective programmed statuses by comparing the reference read voltages and the optimal read voltages for the respective programmed statuses.

The LTDR determination block 1222B may determine whether a deterioration phenomenon due to LTDR has occurred on memory cells of the memory device on which the read operation has been performed, based on the read voltage difference values corresponding to the respective programmed statuses detected by the read voltage comparison block 1222A. The deterioration phenomenon due to LTDR refers to a phenomenon in which a threshold voltage distribution of memory cells is lowered by a charge sharing phenomenon between the memory cells at room temperature. Particularly, the deterioration phenomenon may be intensified in a programmed status having a high threshold voltage distribution. Therefore, when read voltage difference values of at least one or more most significant programmed statuses having relatively high threshold voltages among a plurality of programmed statuses are greater than read voltage difference values of the other program programmed statuses, the LTDR determination block 1222B may determine that the deterioration phenomenon due to LTDR has occurred on the memory cells on which the read operation has been performed.

Based on a result of determining the deterioration characteristics of the memory cells by the LTDR determination block 1222B, the algorithm select block 1222C may select any one of a plurality of algorithms for improving the retention characteristics. For example, when the LTDR determination block 1222B determines that the deterioration phenomenon due to LTDR has occurred on the memory cells, the algorithm select block 1222C may select a re-program algorithm of the plurality of algorithms. When the LTDR determination block 1222B determines that the deterioration phenomenon due to reasons other than the LTDR has occurred on the memory cells, the algorithm select block 1222C may select a reclaim algorithm of the plurality of algorithms.

The re-program control block 1222D may control the memory device 1100 to perform, when the re-program algorithm is selected by the algorithm select block 1222C, a re-program operation on the memory cells on which the read operation has been performed.

The reclaim control block 1222E may control the memory device 1100 to perform, when the reclaim algorithm is selected by the algorithm select block 1222C, a reclaim operation on a memory block including the memory cells on which the read operation has been performed.

Figure 4:
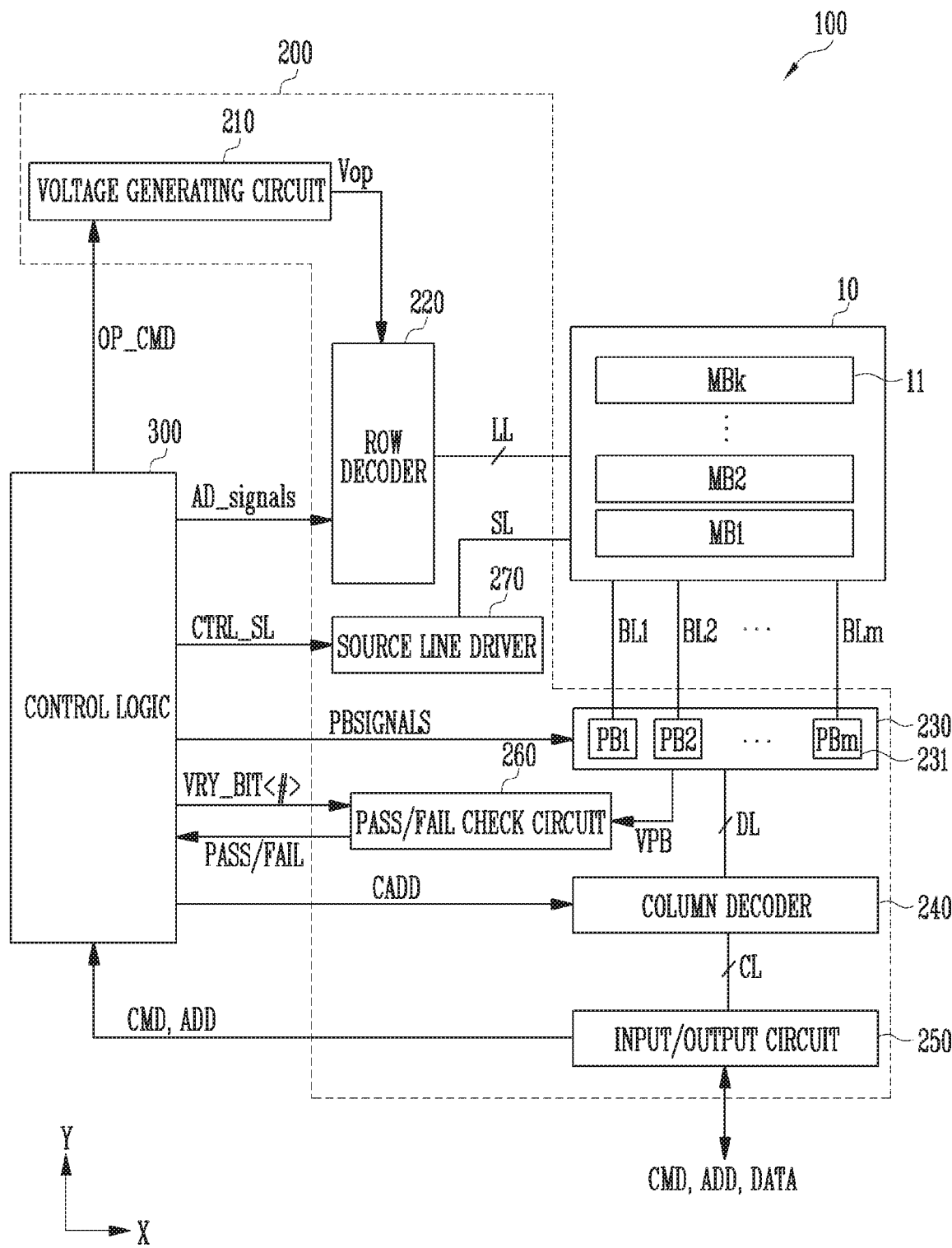
FIG. 4 is a diagram describing a semiconductor memory of the memory system of FIG. 1 in accordance with an embodiment of the present disclosure.

FIG. 4 is a diagram of a configuration of the semiconductor memory 100 of FIG. 1 in accordance with an embodiment.

Referring to FIG. 4, the semiconductor memory 100 may include a memory cell array 10 configured to store data. The semiconductor memory 100 may include peripheral circuits 200 configured to perform a program operation for storing data in the memory cell array 10, a read operation for outputting the stored data, and an erase operation for erasing the stored data. The semiconductor memory 100 may include a control logic 300 configured to control the peripheral circuits 200 under control of the controller (1200 of FIG. 1).

The memory cell array 10 may include a plurality of memory blocks MB1 to MBk generally designated with numeral 11, where k is a positive integer. Local lines LL and bit lines BL1 to BLm (where m is a positive integer) may be coupled to each of the memory blocks 11. For example, the local lines LL may include a first select line, a second select line, and a plurality of word lines arranged between the first and the second select lines. The local lines LL may include dummy lines arranged between the first select line and the word lines and between the second select line and the word lines. For example, the first select line may be a source select line, and the second select line may be a drain select line. For example, the local lines LL may include word lines, drain and source select lines, and source lines SL. For example, the local lines LL may further include dummy lines. For example, the local lines LL may further include pipelines. The local lines LL may be coupled to each of the memory blocks 11. The bit lines BL1 to BLm may be coupled in common to the memory blocks 11. The memory blocks 11 may be embodied in a two- or three-dimensional structures. For example, in the memory blocks 11 having a two-dimensional structure, the memory cells may be arranged in a direction parallel to a substrate. For instance, in the memory blocks 11 having a three-dimensional structure, the memory cells may be stacked in a direction perpendicular to the substrate.

At least one of the memory blocks 11 may be defined as a system memory block. A read retry table including information about a plurality of read voltages to be used during a read retry operation may be stored in the system memory block. The read retry table may be read during a booting operation of the memory system 1000 and stored in the buffer memory 1230 of the controller 1200.

The peripheral circuits 200 may perform a program operation, a read operation, or an erase operation on a selected memory block 11 under control of the control logic 300. For instance, the peripheral circuits 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop to be used for a program operation, a read operation, and an erase operation in response to an operating signal OP_CMD. Furthermore, the voltage generating circuit 210 may selectively discharge the local lines LL in response to an operating signal OP_CMD. For example, the voltage generating circuit 210 may generate a program voltage, a verify voltage, a pass voltage, and a select transistor operating voltage under control of the control logic 300.

The row decoder 220 may transmit operating voltages Vop to local lines LL coupled to a selected one among the memory blocks 11 in response to control signals AD_signals. For example, the row decoder 220 may selectively apply operating voltages (e.g., a program voltage, a verify voltage, and a pass voltage) generated from the voltage generating circuit 210 to the word lines among the local lines LL in response to row decoder control signals AD_signals.

During a program voltage applying operation, in response to the control signals AD_signals, the row decoder 220 may apply a program voltage generated by the voltage generating circuit 210 to a selected word line of the local lines LL, and apply a pass voltage generated by the voltage generating circuit 210 to the other unselected word lines. During a read operation, in response to the control signals AD_signals, the row decoder 220 may apply a read voltage generated by the voltage generating circuit 210 to a selected word line of the local lines LL, and apply a pass voltage generated by the voltage generating circuit 210 to the other unselected word lines.

The page buffer group 230 may include a plurality of page buffers PB1 to PBm generally designated with numeral 231 which are coupled to the bit lines BL1 to BLm. The page buffers 231 may operate in response to page buffer control signals PBSIGNALS. For instance, the page buffers 231 may temporarily store data to be programmed during a program operation, or sense voltages or currents of the bit lines BL1 to BLm during a read or verify operation.

The column decoder 240 may transmit data between the input/output circuit 250 and the page buffer group 230 in response to a column address CADD. For example, the column decoder 240 may exchange data with the page buffers 231 through data lines DL or exchange data with the input/output circuit 250 through column lines CL.

The input/output circuit 250 may transmit an internal command CMD or an address ADD received from the controller (1200 of FIG. 1) to the control logic 300, or exchange data with the column decoder 240.

During a read operation, the pass/fail check circuit 260 may generate a reference current in response to an enable bit VRY_BIT<#>, and may compare a sensing voltage VPB received from the page buffer group 230 with a reference voltage generated by the reference current and output a pass signal PASS or a fail signal FAIL.

The source line driver 270 may be coupled, through the source line SL, to the memory cells included in the memory cell array 10, and may control a voltage to be applied to the source line SL. The source line driver 270 may receive a source line control signal CTRL_SL from the control logic 300, and control a source line voltage to be applied to the source line SL based on the source line control signal CTRL_SL.

The control logic 300 may control the peripheral circuits 200 by outputting an operating signal OP_CMD, control signals AD_signals, page buffer control signals PBSIGNALS, and an enable bit VRY_BIT<#> in response to an internal command CMD and an address ADD. In addition, the control logic 300 may determine whether a target memory cell has passed a verification during a verify operation in response to a pass signal PASS or a fail signal FAIL.

Figure 5:
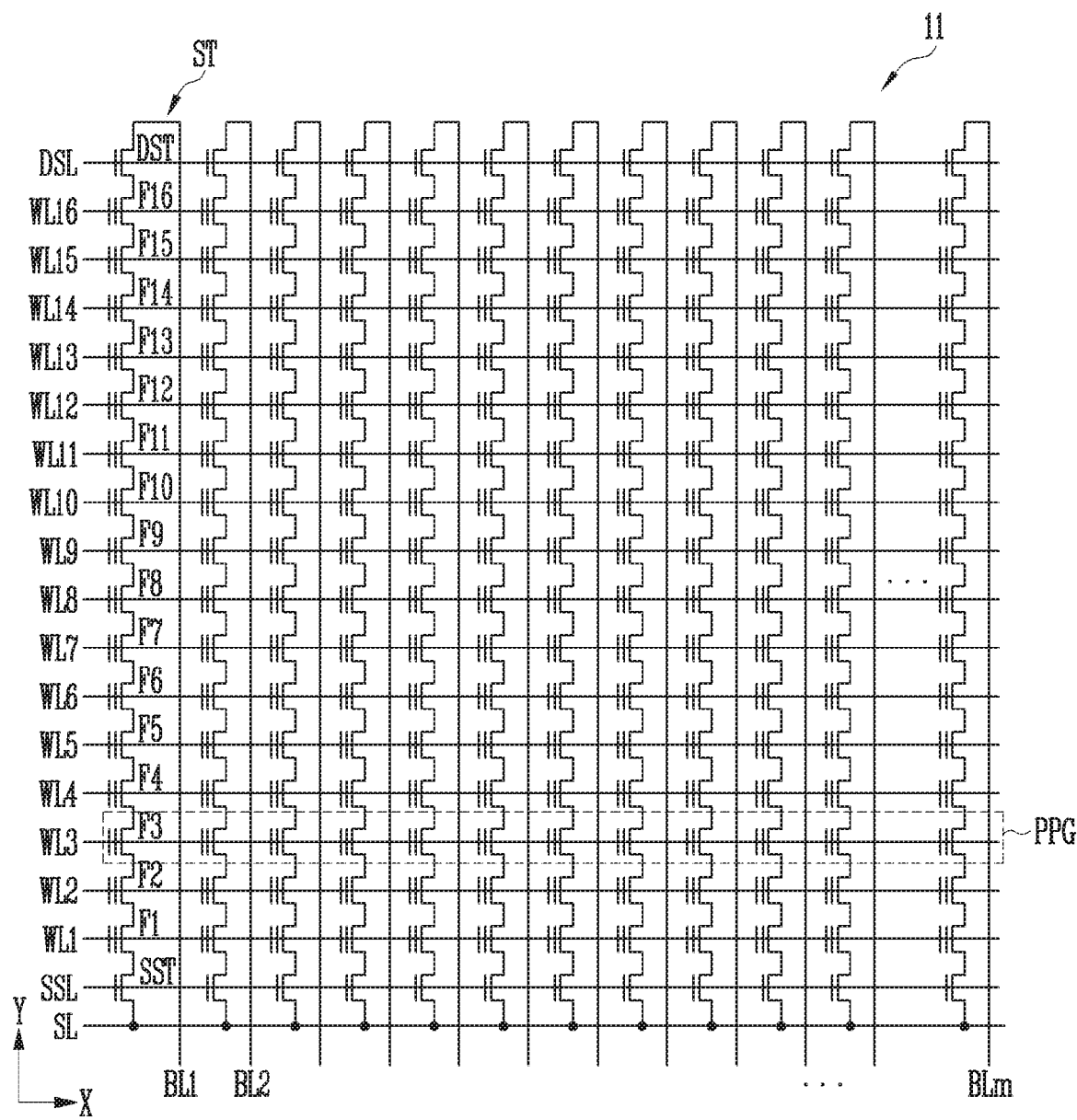
FIG. 5 is a diagram illustrating a memory block of the semiconductor memory of FIG. 4 in accordance with an embodiment of the present disclosure.

FIG. 5 is a diagram illustrating a configuration of a memory block MB1 of FIG. 4 according to an embodiment. It is noted that each of the memory blocks 11 may have the same configuration as the MB1.

Referring to FIG. 5, in the memory block MB1, a plurality of word lines arranged parallel to each other may be coupled between a first select line and a second select line. For example, the first select line may be a source select line SSL, and the second select line may be a drain select line DSL. In more detail, the memory block MB1 may include a plurality of strings ST coupled between the bit lines BL1 to BLm and the source line SL. The bit lines BL1 to BLm may be respectively coupled to the strings ST, and the source line SL may be coupled in common to the strings ST. The strings ST may have the same configuration; therefore, the string ST that is coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. At least one source select transistor SST and at least one drain select transistor DST may be included in each string ST, and a larger number of memory cells than the number of memory cells F1 to F16 shown in the drawing may be included in each string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST may be coupled to the drain select line DSL, and gates of the memory cells F1 to F16 may be coupled to the plurality of word lines WL1 to WL16. Among the memory cells included in different strings ST, a group of memory cells coupled to each word line may be referred to as a physical page PPG. Therefore, the number of physical pages PPG included in the memory block MB1 may correspond to the number of word lines WL1 to WL16.

Each memory cell may store 1-bit data. This memory cell is typically called a single level cell (SLC). In this case, each physical page PPG may store data of a single logical page LPG. Data of each logical page LPG may include data bits corresponding to the number of cells included in a single physical page PPG. Each memory cell may store 2- or more-bit data. This memory cell is typically called a multi-level cell (MLC). In this case, each physical page PPG may store data of two or more logical pages LPG.

Figure 6:
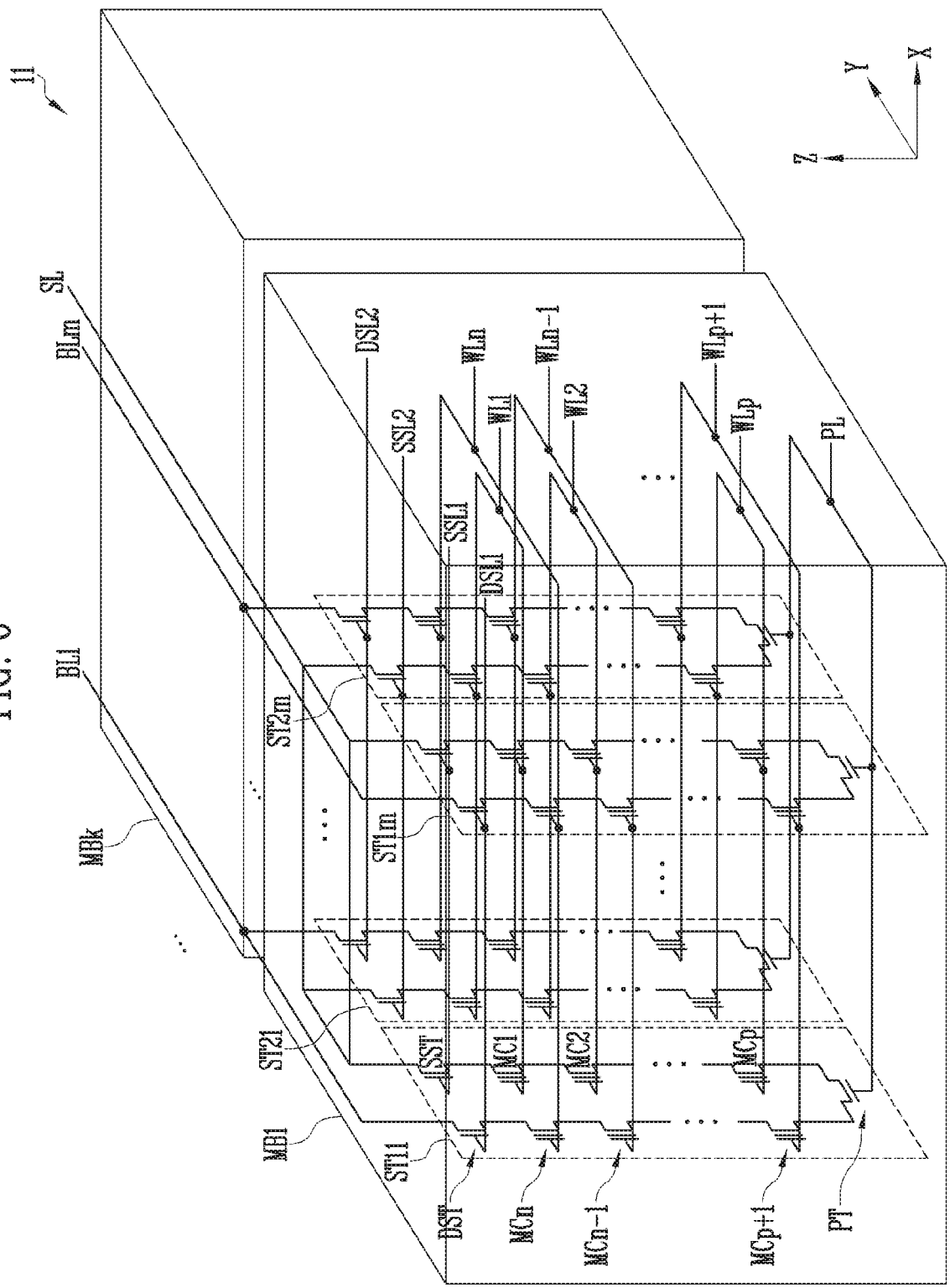
FIG. 6 is a diagram illustrating a memory block of the semiconductor memory of FIG. 4 which has a three-dimensional structure in accordance with an embodiment of the present disclosure.

FIG. 6 is a diagram illustrating an example of a memory block MB1 having a three-dimensional structure in accordance with an embodiment of the present disclosure.

Referring to FIG. 6, the memory cell array 10 may include a plurality of memory blocks 11 including memory blocks MB1 to MBk. Each of the memory blocks 11 may have the configuration of memory block MB1 as shown in FIG. 6. Specifically, memory block MB1 may include a plurality of strings ST11 to ST1*m* and ST21 to ST2*m*. In an embodiment, each of the strings ST11 to ST1*m* and ST21 to ST2*m* may be formed in a 'U' shape. In the first memory block MB1, m strings may be arranged in a row direction (i.e. an X direction). FIG. 6 illustrates that two strings are arranged in a column direction (i.e., a Y direction), but this is only for the sake of explanation. For example, three or more strings may be arranged in the column direction (the Y direction).

Each of the plurality of strings ST11 to ST1*m* and ST21 to ST2*m* may include at least one source select transistor SST, first to n-th memory cells MC1 to MCn, a pipe transistor PT, and at least one drain select transistor DST.

The source select transistor SST, the drain select transistor DST, and the memory cells MC1 to MCn may have structures similar to each other. For example, each of the source select transistor SST, the drain select transistor DST, and the memory cells MC1 to MCn may include a channel layer, a tunnel insulating layer, a charge trap layer, and a blocking insulating layer. For example, a pillar for providing the channel layer may be provided in each string. For instance, a pillar for providing at least one of the channel layer, the tunnel insulating layer, the charge trap layer, and the blocking insulating layer may be provided in each string.

The source select transistor SST of each string may be coupled between the source line SL and the memory cells MC1 to MCn.

In an embodiment, source select transistors of strings arranged in the same row may be coupled to a source select line extending in the row direction. Source select transistors of strings arranged in different rows may be coupled to different source select lines. In FIG. 6, source select transistors of the strings ST11 to ST1*m* in a first row may be coupled to a first source select line SSL1. Source select transistors of the strings ST21 to ST2*m* in a second row may be coupled to a second source select line SSL2.

In an embodiment, the source select transistors of the strings ST11 to ST1*m* and ST21 to ST2*m* may be coupled in common to a single source select line.

The first to n-th memory cells MC1 to MCn in each string may be coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp may be successively arranged in a vertical direction (i.e., in a Z direction) and coupled in series to each other between the source select transistor SST and the pipe transistor PT. The p+1-th to n-th memory cells MCCp+1 to MCn may be successively arranged in the vertical direction (the Z direction) and coupled in series to each other between the pipe transistor PT and the drain select transistor DST. The first to p-th memory cells MC1 to MCp and the p+1-th to n-th memory cells MCp+1 to MCn may be coupled to each other through the pipe transistor PT. Gates of the first to n-th memory cells MC1 to MCn of each string may be respectively coupled to first to n-th word lines WL1 to WLn.

In an embodiment, at least one of the first to n-th memory cells MC1 to MCn may be used as a dummy memory cell.

In the case where the dummy memory cell is provided, the voltage or the current of the corresponding string may be stably controlled. Gates of the pipe transistors PT of the respective strings may be coupled to a pipeline PL.

The drain select transistor DST of each string may be coupled between the corresponding bit line and the memory cells MCp+1 to MCn. Strings arranged in the row direction may be coupled to corresponding drain select lines extending in the row direction. The drain select transistors of the strings ST11 to ST1m in the first row may be coupled to a first drain select line DSL1. The drain select transistors of the strings ST21 to ST2m in the second row may be coupled to a second drain select line DSL2.

Strings arranged in the column direction may be coupled to corresponding bit lines extending in the column direction. In FIG. 6, the strings ST11 and ST21 in a first column may be coupled to a first bit line BL1. The strings ST1m and ST2m in an m-th column may be coupled to an m-th bit line BLm.

Among the strings arranged in the row direction, memory cells coupled to the same word line may form one page. For example, memory cells coupled to the first word line WL1 in the strings ST11 to ST1m of the first row may form a single page. Memory cells coupled to the first word line WL1 in the strings ST21 to ST2m of the second row may form another single page. When any one of the drain select lines DSL1 and DSL2 is selected, strings arranged in the corresponding row may be selected. When any one of the word lines WL1 to WLn is selected, a corresponding single page may be selected from the selected strings.

Figure 7:
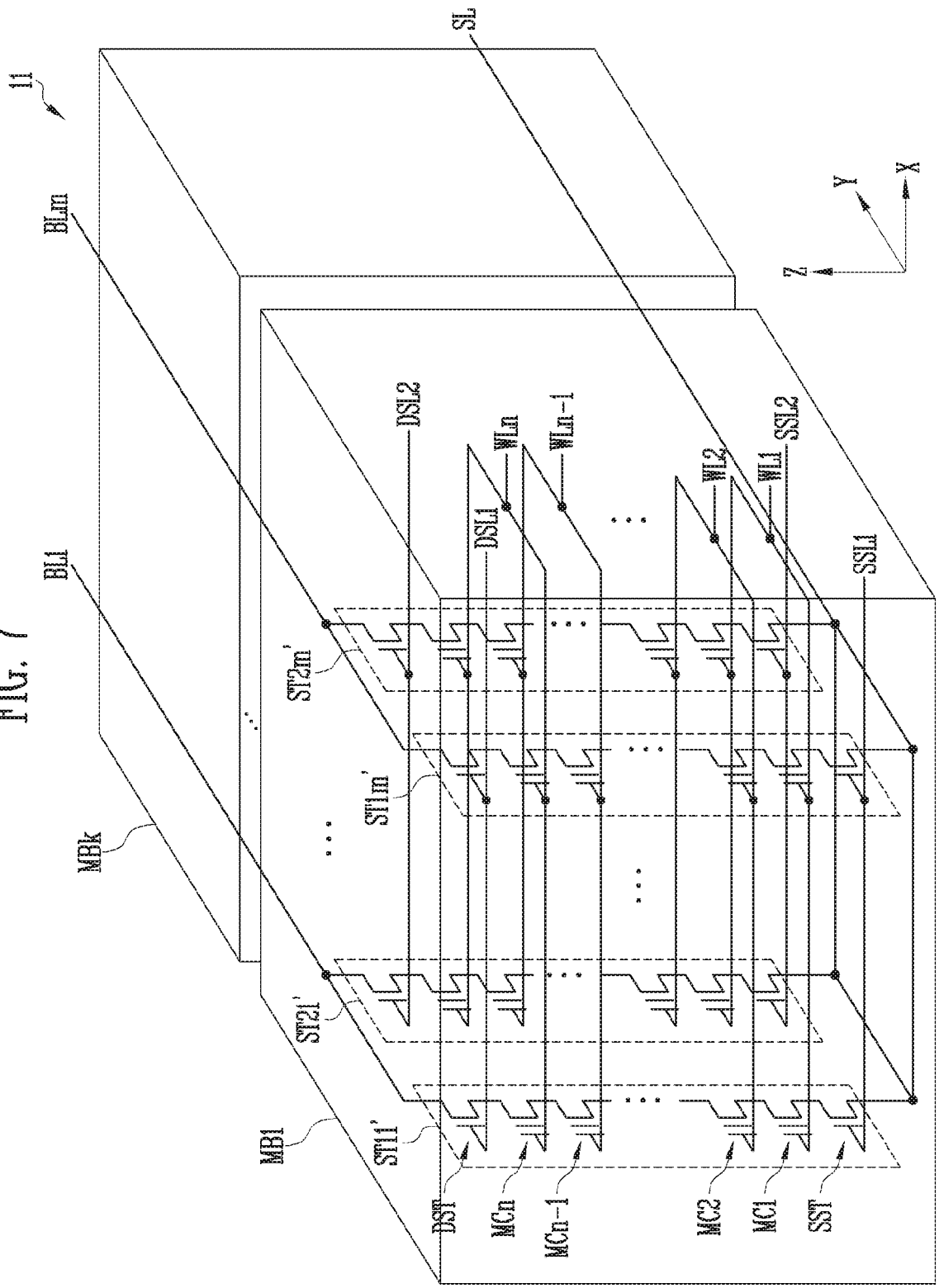
FIG. 7 is a diagram illustrating a memory block of the semiconductor memory of FIG. 4 which has a three-dimensional structure in accordance with an embodiment of the present disclosure.

FIG. 7 is a diagram illustrating an example of a memory block MB1 having a three-dimensional structure in accordance with an embodiment of the present disclosure.

Referring to FIG. 7, the memory cell array 10 may include a plurality of memory blocks MB1 to MBk generally designated with numeral 11. Each of the memory blocks 11 may have the configuration of the first memory block MB1 as shown in FIG. 7. Specifically, memory block MB1 may include a plurality of strings ST11' to ST1m' and ST21' to ST2m'. Each of the strings ST11' to ST1m' and ST21' to ST2m' may extend in a vertical direction (i.e., in a Z direction). In each memory block 11, m strings may be arranged in a row direction (i.e., in an X direction). FIG. 7 illustrates that two strings are arranged in a column direction (i.e., in a Y direction), but this is only for the sake of explanation. For example, three or more strings may be arranged in the column direction (the Y direction).

Each of the strings ST11' to ST1m' and ST21' to ST2m' may include at least one source select transistor SST, first to n-th memory cells MC1 to MCn, and at least one drain select transistor DST.

The source select transistor SST of each string may be coupled between the source line SL and the memory cells MC1 to MCn. Source select transistors of strings arranged in the same row may be coupled to the same source select line. The source select transistors of the strings ST11' to ST1m' arranged in a first row may be coupled to a first source select line SSL1. The source select transistors of the strings ST21' to ST2m' arranged in a second row may be coupled to a second source select line SSL2. In an embodiment, the source select transistors of the strings ST11' to ST1m' and ST21' to ST2m' may be coupled in common to a single source select line.

The first to nth memory cells MC1 to MCn in each string may be coupled in series between the source select transistor SST and the drain select transistor DST. Gates of the first to n-th memory cells MC1 to MCn may be respectively coupled to first to n-th word lines WL1 to WLn.

In an embodiment, at least one of the first to n-th memory cells MC1 to MCn may be used as a dummy memory cell. In the case where the dummy memory cell is provided, the voltage or the current of the corresponding string may be stably controlled. Thereby, the reliability of data stored in each of the memory blocks 11 may be improved.

The drain select transistor DST of each string may be coupled between the corresponding bit line and the memory cells MC1 to MCn. Drain select transistors DST of strings arranged in the row direction may be coupled to corresponding drain select lines extending in the row direction. The drain select transistors DST of the strings ST11' to ST1m' in the first row may be coupled to a first drain select line DSL1. The drain select transistors DST of the strings ST21' to ST2m' in the second row may be coupled to a second drain select line DSL2.

Figure 8:
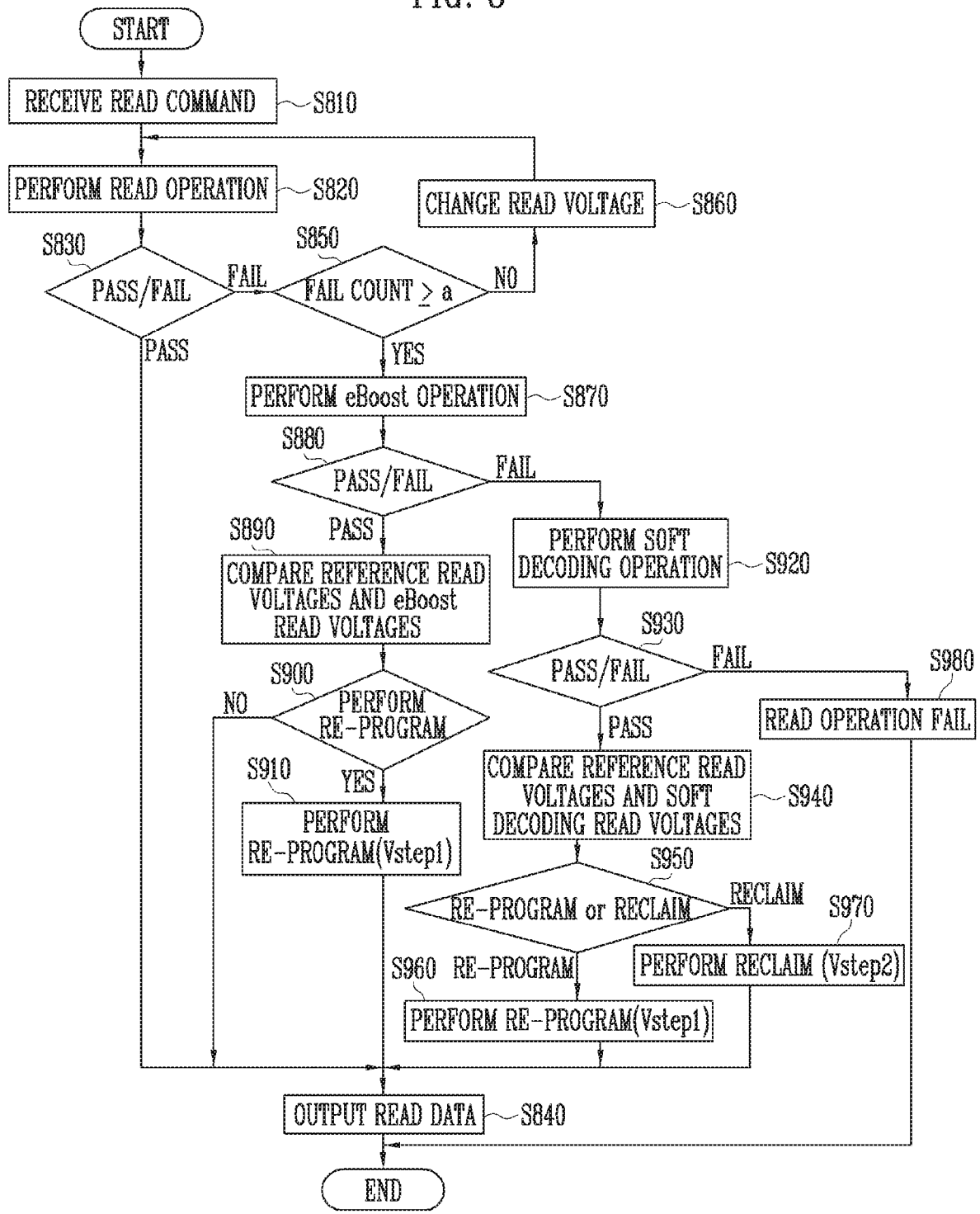
FIG. 8 is a flowchart of an operation of the memory system in accordance with an embodiment of the present disclosure.

FIG. 8 is a flowchart of an operation of the memory system in accordance with an embodiment of the present disclosure.

Figure 9:
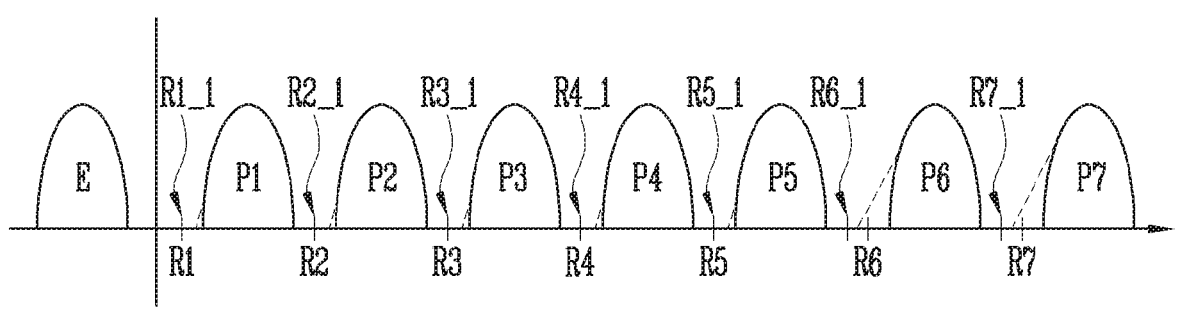
FIG. 9 is a threshold voltage distribution diagram describing a reference read voltage and an eBoost read voltage during a read operation in accordance with an embodiment of the present disclosure.

FIG. 9 is a threshold voltage distribution diagram for describing a reference read voltage and an eBoost read voltage during a read operation in accordance with an embodiment of the present disclosure. FIG. 9 exemplifies a threshold voltage distribution of triple level cells (TLCs) having seven program statuses P1 to P7 and an erased status E. As exemplified in FIG. 9, program status P6 or P7 may be a more significant program status than any one among remaining program statuses P1 to P5. The more significant program statuses P6 and P7 may have higher threshold voltage distribution than the less significant program statuses P1 to P5. Dotted lines illustrated in FIG. 9 may represent deteriorated threshold voltage distribution of respective program statuses P1 to P7. As described above and as exemplified in FIG. 9, the deterioration may be intensified in the more significant program statuses (e.g., the program statuses P6 and P7) having higher threshold voltage distribution.

The operation of the memory system in accordance with an embodiment of the present disclosure will be described with reference to FIGS. 1 to 9.

When, at step S810, a host command Host_CMD, i.e., a read command, is received from the host 1300, the processor 1220 of the controller 1200 generates a command queue by queuing the received read command Host_CMD.

The flash control circuit 1250 may then generate an internal command CMD for controlling a read operation of the memory device 1100 in response to the read command Host_CMD queued to the command queue and transmit the internal command CMD to the memory device 1100.

The memory device 1100 may perform the read operation in response to the internal command CMD received from the controller 1200, at step S820. For example, a semiconductor memory selected from among the plurality of semiconductor memories 100 included in the memory device 1100 may perform the read operation in response to the received internal command CMD. For example, the read voltage may be performed using initial reference read voltages (e.g., R1 to R7 of FIG. 9). The memory device 1100 may transmit, to the controller 1200, the data read as a result of the read operation.

The error correction circuit 1240 of the controller 1200 may perform an error correction operation for the read data received from the memory device 1100 and determine a result of the error correction operation, at step S830. For example, the error correction circuit 1240 may perform an ECC decoding operation for read data received from the memory device 1100 through the flash control circuit 1250. The error corrected read data may be transmitted to the read buffer 1232 of the buffer memory 1230. For example, depending on the number of error bits included in the read data received from the memory device 1100, it may be determined that the error correction operation has passed or failed. For example, in the case where the number of error bits included in the read data received from the memory device 1100 is equal to or less than the maximum allowed number of error bits of the error correction circuit 1240, the error correction circuit 1240 normally performs an ECC decoding operation and determines that the error correction operation has passed. On the other hand, in the case where the number of error bits included in the read data received from the memory device 1100 is greater than the maximum allowed number of error bits of the error correction circuit 1240, the error correction circuit 1240 determines that the error correction operation has failed.

If a result of the above-mentioned determination operation S830 indicates that the error correction operation has passed (PASS), the read data transmitted to and stored in the read buffer 1232 of the buffer memory 1230 may be transmitted to the host 1300 by the host control circuit 1210, at step S840.

If the result of the above-mentioned operation S830 indicates that the error correction operation has failed (FAIL), the processor 1220 may determine whether or not the number of times the read operation has failed is equal to or greater than a preset value (e.g., "a"), at step S850. The preset value "a" may be equal to or less than the number of read voltage sets included in the read retry table.

If a result of step S850 indicates that the number of times the read operation has failed is less than the preset value "a" (NO), one of the plurality of read voltage sets included in the read retry table is selected, and read voltages respectively corresponding to the plurality of programmed statuses P1 to P7 are changed, at step S860.

Thereafter, the process may be repeated from step S820 using the read voltages changed according to the read retry table.

If the result of the step S850 indicates that the number of times the read operation has failed is equal to or greater than the preset value "a" (YES), the processor 1220 may determine that the threshold voltage distribution of the memory cells on which the read operation has been performed has deteriorated, and control the memory device 1100 to perform an eBoost operation for more accurately reading data, at step S870.

The eBoost operation may determine (e.g., find) optimal read voltages for which the number of error bits is minimized. The eBoost operation may set the optimal read voltages as eBoost read voltages (e.g., R1_1 to R7_1 of FIG. 9), and then perform a read operation using the eBoost read voltages R1_1 to R7_1.

The memory device 1100 may transmit data read as a result of the eBoost operation to the error correction circuit 1240 of the controller 1200. The error correction circuit 1240 may perform an ECC decoding operation on the received read data. The error corrected read data may be transmitted to the read buffer 1232 of the buffer memory 1230. For example, in the case where the number of error bits included in the received read data is equal to or less than the maximum allowed number of error bits of the error correction circuit 1240, the error correction circuit 1240 may normally perform an ECC decoding operation and determine that the error correction operation has passed. On the other hand, in the case where the number of error bits included in the read data received from the memory device 1100 is greater than the maximum allowed number of error bits of the error correction circuit 1240, the error correction circuit 1240 may determine that the error correction operation has failed, at step S880.

If a result of the determination operation (S880) indicates that the error correction operation has passed (PASS), the read voltage comparison block 1222A of the retention characteristic improvement block 1222 may compare, at step S890, the reference read voltages R1 to R7 with the optimal read voltages, i.e., the eBoost read voltages R1_1 to R7_1, and detect read voltage difference values corresponding to the respective programmed statuses based on a result of the comparison.

The LTDR determination block 1222B may determine whether a deterioration phenomenon due to LTDR has been generated on memory cells of the memory device on which the read operation has been performed, based on the read voltage difference values corresponding to the respective programmed statuses detected by the read voltage comparison block 1222A. In other words, when read voltage difference values of at least one or more most significant programmed statuses (e.g., programmed statuses P6 and P7) having relatively high threshold voltages are greater than read voltage difference values of the other program programmed statuses among a plurality of programmed statuses, the LTDR determination block 1222B may determine that the deterioration phenomenon due to LTDR has occurred on the memory cells on which the read operation has been performed. Although in the present embodiment the two programmed statuses P6 and P7 have been defined as the most significant programmed statuses, the present disclosure is not limited thereto, and at least one or more programmed statuses having highest threshold voltages among the plurality of programmed statuses may be defined as most significant programmed statuses.

Based on a result of determining the deterioration characteristics of the memory cells by the LTDR determination block 1222B, the algorithm select block 1222C may determine whether to perform a re-program operation, at step S900.

If a result of the above-mentioned determination operation S900 indicates that the re-program operation is not to be performed (NO), the read data transmitted to and stored in the read buffer 1232 of the buffer memory 1230 may be send as output to the host 1300 by the host control circuit 1210, at step S840.

If the result of the above-mentioned determination operation S900 indicates that the re-program operation is to be performed (YES), the re-program control block 1222D controls the memory device 1100 to perform a re-program operation on the memory cells on which the read operation has been performed, at step S910. The re-program operation may be performed in an incremental step pulse programming (ISPP) manner. For example, the program voltage may gradually increase from a first start program voltage by a first step voltage Vstep1.

After the re-program operation has been performed on the memory cells on which the read operation has been performed, the read data transmitted to and stored in the read buffer 1232 of the buffer memory 1230 may be send as output to the host 1300 by the host control circuit 1210, at step S840.

If the result of the determination operation (S880) indicates that the error correction operation has failed (FAIL), the processor 1220 may determine that the eBoost operation has failed, and control the memory device 1100 and the error correction circuit 1240 to perform a soft decoding operation, at step S920.

In an embodiment, the soft decoding operation may be a decoding operation using soft decision data read using a soft decoding read voltage. The soft decoding read voltage may include an above-described eBoost read voltage R1_1 to R7_1.

If a result of the soft decoding operation indicates that the number of error bits included in the soft decision data is equal to or less than the maximum allowed number of error bits of the error correction circuit 1240, the error correction circuit 1240 may normally perform an ECC decoding operation and determine that the error correction operation has passed. When, however, the number of error bits included in the soft decision data is greater than the maximum allowed number of error bits of the error correction circuit 1240, the error correction circuit 1240 may determine that the error correction operation has failed, at step S930.

When a result of the determination operation (S930) indicates that the error correction operation has passed (PASS), the read voltage comparison block 1222A of the retention characteristic improvement block 1222 may compare, at step S940, the reference read voltages R1 to R7 with the optimal read voltages, i.e., the soft decoding read voltages and detect read voltage difference values corresponding to the respective programmed statuses based on a result of the comparison.

The LTDR determination block 1222B may determine whether a deterioration phenomenon due to LTDR has been generated on memory cells of the memory device on which the read operation has been performed, based on the read voltage difference values corresponding to the respective programmed statuses detected by the read voltage comparison block 1222A. In other words, when read voltage difference values of at least one or more most significant programmed statuses (e.g., programmed statuses P6 and P7) having relatively high threshold voltages are greater than read voltage difference values of the other program programmed statuses among a plurality of programmed statuses, the LTDR determination block 1222B may determine that the deterioration phenomenon due to LTDR has occurred on the memory cells on which the read operation has been performed.

Based on a result of determining the deterioration characteristics of the memory cells by the LTDR determination block 1222B, the algorithm select block 1222C determines whether to perform a re-program operation or a reclaim operation, at step S950. For example, when the LTDR determination block 1222B determines that the deterioration phenomenon due to LTDR has occurred on the memory cells, the algorithm select block 1222C may select a re-program algorithm. When the LTDR determination block 1222B determines that the deterioration phenomenon due to reasons other than the LTDR has occurred on the memory cells, the algorithm select block 1222C may select a reclaim algorithm.

When at step S950 the reprogram algorithm has been selected (REPROGRAM), the reprogram control block 1222D controls the memory device 1100 to perform a reprogram operation on the memory cells on which the read operation has been performed, at step S960.

When at step S950 the reclaim algorithm has been selected (RECLAIM), the reclaim control block 1222E controls the memory device 1100 to perform a reclaim operation on a memory block including the memory cells on which the read operation has been performed, at step S970.

During the reclaim operation, valid data of the memory block including the memory cells on which the read operation has been performed is read. The read valid data is programmed to a new memory block having an erased status. During the reclaim operation, the program operation on the new memory block may be performed in an ISPP manner using a second start program voltage and a second step voltage Vstep2. The second start program voltage may be lower than the first start program voltage. The second step voltage may be greater than the first step voltage. Furthermore, after the reclaim operation has been performed, a map data update operation of newly mapping, to a physical address of the new memory block, a logical address mapped to a physical address of the selected memory block.

After step 960 or step S970, the read data transmitted to and stored in the read buffer 1232 of the buffer memory 1230 may be send as output to the host 1300 by the host control circuit 1210, at step S840.

As described above, in various embodiments of the present disclosure, during an eBoost operation and a soft decoding operation, it is determined whether a deterioration phenomenon of memory cells on which a read operation has been performed is a deterioration phenomenon due to LTDR. If it is determined that the deterioration phenomenon is due to LTDR, a re-program operation is performed. If it is determined that the deterioration phenomenon is due to reasons other than the LTDR, a reclaim operation is performed. Therefore, the threshold voltage distribution of the memory cells on which the deterioration phenomenon due to LTDR has occurred is restored to a normal range, whereby the data retention characteristics of the memory system may be improved. Furthermore, when the deterioration phenomenon is due to LTDR, the re-program operation which has a relatively short program time and does not need a map data update operation, is performed in lieu of the reclaim operation. Thus, the operating speed and the current consumption of the memory system may be improved.

Figure 10:
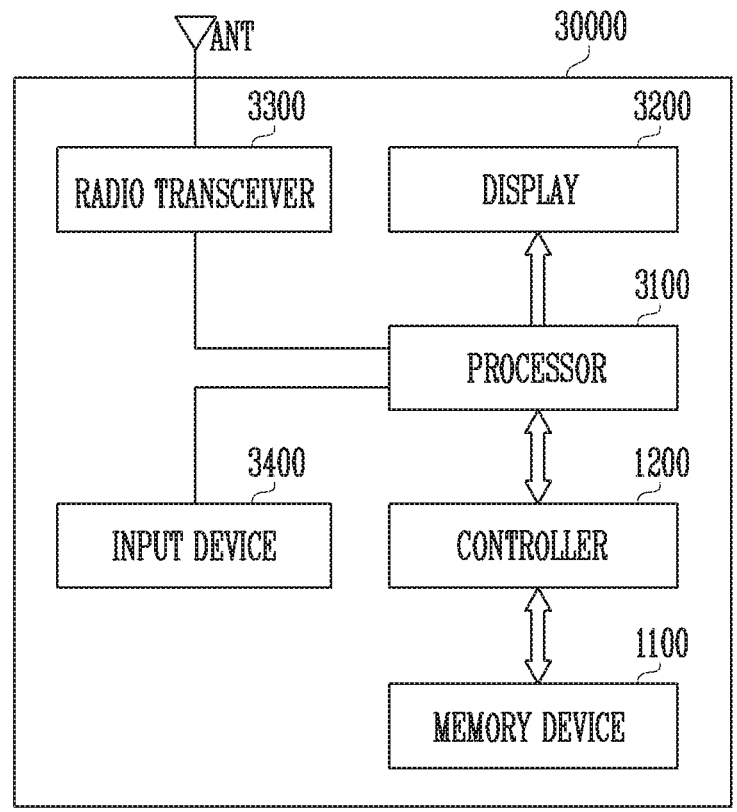
FIG. 10 is a diagram illustrating a memory system in accordance with another embodiment of the present disclosure.

FIG. 10 is a diagram illustrating a memory system 30000 in accordance with an embodiment of the present disclosure.

Referring to FIG. 10, the memory system 30000 may be embodied in a cellular phone, a smartphone, a tablet PC, a personal digital assistant (PDA) or a wireless communication device. The memory system 30000 may include a memory device 1100, and a controller 1200 capable of controlling the operation of the memory device 1100. The controller 1200 may control a data access operation, e.g., a program operation, an erase operation, or a read operation, of the memory device 1100 under control of a processor 3100.

Data programmed to the memory device 1100 may be send as output through a display 3200 under control of the controller 1200.

A radio transceiver 3300 may send and receive radio signals through an antenna ANT. For example, the radio transceiver 3300 may change a radio signal received through the antenna ANT into a signal capable of being processed in the processor 3100. Therefore, the processor 3100 may process a signal output from the radio transceiver 3300 and transmit the processed signal to the controller 1200 or the display 3200. The controller 1200 may program a signal processed by the processor 3100 to the memory device 1100. Furthermore, the radio transceiver 3300 may change a signal output from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be embodied in a pointing device such as a touch pad, a computer mouse, a keypad or a keyboard. The processor 3100 may control the operation of the display 3200 such that data output from the memory controller 1200, data output from the radio transceiver 3300, or data output form the input device 3400 is output through the display 3200.

In an embodiment, the controller 1200 capable of controlling the operation of the memory device 1100 may be embodied as a part of the processor 3100 or a chip provided separately from the processor 3100. Alternatively, the controller 1200 may be embodied by an example of the controller shown in FIG. 2.

Figure 11:
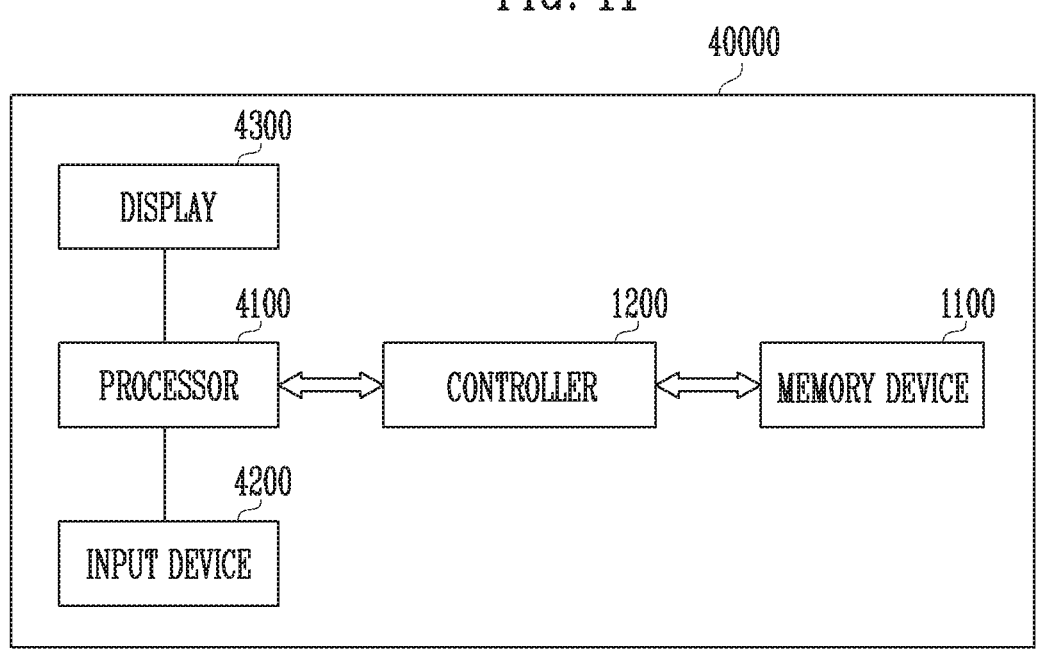
FIGS. 11 to 13 are block diagrams illustrating various memory systems in accordance with embodiments of the present disclosure.

FIG. 11 is a diagram illustrating a memory system 40000 in accordance with an embodiment of the present disclosure.

Referring to FIG. 11, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include a memory device 1100, and a controller 1200 capable of controlling a data processing operation of the memory device 1100.

A processor 4100 may output data stored in the memory device 1100 through a display 4300, according to data input from an input device 4200. For example, the input device 4200 may be embodied in a pointing device such as a touch pad, a computer mouse, a keypad, or a keyboard.

The processor 4100 may control the overall operation of the memory system 40000 and control the operation of the controller 1200. In an embodiment, the controller 1200 capable of controlling the operation of the memory device 1100 may be embodied as a part of the processor 4100 or a chip provided separately from the processor 4100. Alternatively, the controller 1200 may be embodied by an example of the controller shown in FIG. 2.

Figure 12:
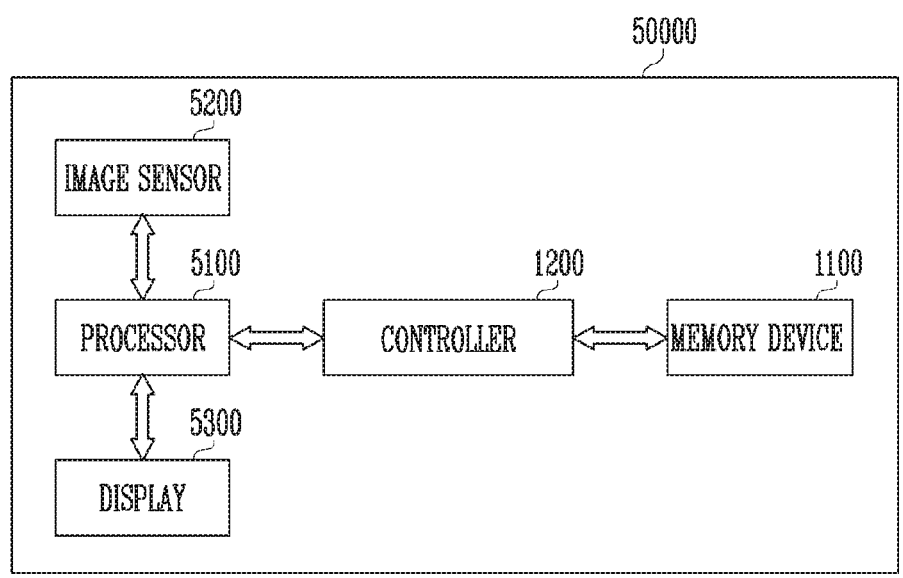

FIG. 12 is a diagram illustrating a memory system 50000 in accordance with an embodiment of the present disclosure.

Referring to FIG. 12, the memory system 50000 may be embodied in an image processing device, e.g., a digital camera, a portable phone provided with a digital camera, a smartphone provided with a digital camera, or a tablet PC provided with a digital camera.

The memory system 50000 may include a memory device 1100, and a controller 1200 capable of controlling a data processing operation, e.g., a program operation, an erase operation, or a read operation, of the memory device 1100.

An image sensor 5200 of the memory system 50000 may convert an optical image into digital signals. The converted digital signals may be transmitted to a processor 5100 or the controller 1200. Under control of the processor 5100, the converted digital signals may be sent as output through a display 5300 or stored to the memory device 1100 through the controller 1200. Data stored in the memory device 1100 may be send as output through the display 5300 under control of the processor 5100 or the controller 1200.

In an embodiment, the controller 1200 capable of controlling the operation of the memory device 1100 may be embodied as a part of the processor 5100 or a chip provided separately from the processor 5100. Alternatively, the controller 1200 may be embodied by an example of the controller shown in FIG. 2.

Figure 13:
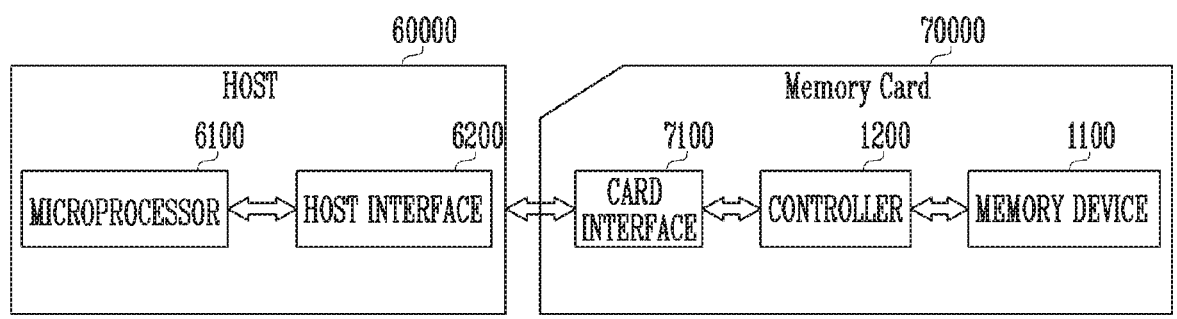

FIG. 13 is a diagram illustrating a memory system 70000 in accordance with an embodiment of the present disclosure.

Referring to FIG. 13, the memory system 70000 may be embodied in a memory card or a smart card. The memory system 70000 may include a memory device 1100, a controller 1200, and a card interface 7100.

The memory controller 1200 may control data exchange between the memory device 1100 and the card interface 7100. In an embodiment, the card interface 7100 may be a secure digital (SD) card interface or a multi-media card (MMC) interface, but it is not limited thereto. The controller 1200 may be embodied by an example of the controller 1200 shown in FIG. 2.

The card interface 7100 may interface data exchange between a host 60000 and the controller 1200 according to a protocol of the host 60000. In an embodiment, the card interface 7100 may support a universal serial bus (USB) protocol, and an interchip (IC)-USB protocol. For example, the card interface may refer to hardware capable of supporting a protocol which is used by the host 60000, software installed in the hardware, or a signal transmission scheme.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the controller 1200 under control of a microprocessor 6100.

In various embodiments of the present disclosure, during a read operation of a memory system, deterioration characteristics depending on a threshold voltage distribution of memory cells are determined. A re-program operation or a reclaim operation is performed based on the deterioration characteristics, whereby the retention characteristics of the memory cells may be improved.

Although the embodiments of the present disclosure have been disclosed, those skilled in the art will appreciate that various modifications, additions and substitutions are possible, without departing from the scope and spirit of the present disclosure.

Therefore, the scope of the present disclosure must be defined by the appended claims and equivalents of the claims rather than by the description preceding them.

In the above-discussed embodiments, all steps may be selectively performed or skipped. In addition, the steps in each embodiment may not be always performed in regular order. Furthermore, the embodiments disclosed in the present specification and the drawings aim to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure.

Embodiments of the present disclosure have been described with reference to the accompanying drawings, and specific terms or words used in the description should be construed in accordance with the spirit of the present disclosure without limiting the subject matter thereof. It should be understood that many variations and modifications of the basic inventive concept described herein will still fall within the spirit and scope of the present disclosure as defined in the appended claims and their equivalents.

What is claimed is:

1. A controller comprising:
   a processor configured to control a read operation of a memory device in response to a read command received from a host; and
   an error correction circuit configured to perform an error correction operation on read data obtained by the read operation, wherein the processor is further configured to:
determine deterioration characteristics of the memory device during the read operation, and
control the memory device to perform a re-program operation or a reclaim operation on memory cells on which the read operation has been performed based on the deterioration characteristics.

2. The controller according to claim 1, wherein the processor comprises:
a flash translation layer configured to generate a command queue for controlling the read operation of the memory device in response to the read command; and
a retention characteristic improvement block configured to determine, if the read operation fails, the deterioration characteristics by comparing reference read voltages with optimal read voltages used during the read operation, select any one of the re-program operation or the reclaim operation in response to the determined deterioration characteristics, and control the memory device.

3. The controller according to claim 2,
wherein the flash translation layer controls, during the read operation, the memory device to perform a first read operation using the reference read voltages and read voltage sets included in a read retry table, and
wherein, if a result of a first error correction operation on first read data that is read during the first read operation indicates that a failure has occurred, the flash translation layer controls the memory device to perform a second read operation using the optimal read voltages.

4. The controller according to claim 3,
wherein the flash translation layer controls the memory device to perform an eBoost operation or a soft decoding operation as the second read operation, and
wherein the eBoost operation or the soft decoding operation comprises performing a plurality of read operations while changing a read voltage.

5. The controller according to claim 3, wherein the flash translation layer controls, if a result of a second error correction operation on second read data that is read during the second read operation indicates that no error bit is included or a minimum number of error bits are included, the memory device such that read voltages are set to the optimal read voltages and the second read operation is performed.

6. The controller according to claim 3,
wherein the retention characteristic improvement block detects read voltage difference values respectively corresponding to a plurality of programmed statuses by comparing the reference read voltages and the optimal read voltages, and
wherein the retention characteristic improvement block determines the deterioration characteristics to be low temperature data retention (LTDR) deterioration characteristics when the read voltage difference values of at least one or more most significant programmed statuses having high threshold voltages are greater than read voltage difference values of the other program programmed statuses among the plurality of programmed statuses.

7. The controller according to claim 6,
wherein the retention characteristic improvement block controls the memory device to perform the re-program operation on the memory cells when the deterioration characteristics are the LTDR deterioration characteristics, and wherein the retention characteristic improvement block controls the memory device to perform the reclaim operation on the memory cells when the deterioration characteristics are not the LTDR deterioration characteristics.

8. The controller according to claim 6, wherein the retention characteristic improvement block comprises:
a read voltage comparison block configured to compare the reference read voltages and the optimal read voltages and detect the read voltage difference values respectively corresponding to the plurality of programmed statuses;
an LTDR determination block configured to determine whether the deterioration characteristics of the memory cells are the LTDR deterioration characteristics based on the read voltage difference values respectively corresponding to the plurality of programmed statuses;
an algorithm select block configured to select a re-program algorithm or a reclaim algorithm based on a result of determining the deterioration characteristics of the memory cells by the LTDR determination block;
a re-program control block configured to control, when the re-program algorithm is selected, the memory device to perform the re-program operation; and
a reclaim control block configured to control, when the reclaim algorithm is selected, the memory device to perform the reclaim operation.

9. A memory system comprising:
a memory device including a plurality of data-programmed memory cells; and
a controller configured to control the memory device to perform a read operation on the plurality of memory cells in response to a read command received from a host,
wherein, when a failure occurs during the read operation, the controller further determines deterioration characteristics on the plurality of memory cells and controls the memory device to perform a re-program operation or a reclaim operation on the plurality of memory cells.

10. The memory system according to claim 9, wherein the controller comprises:
a processor configured to control the memory device to perform a first read operation using reference read voltages and read retry voltages during the read operation and configured to control the memory device to set, if the first read operation has failed, optimal read voltages and perform a second read operation; and
an error correction circuit configured to perform an error correction operation on first read data that is read as a result of the first read operation and an error correction operation on second read data that is read as a result of the second read operation and determine that the first read operation and the second read operation have failed based on results of the error correction operations.

11. The memory system according to claim 10,
wherein the processor controls the memory device to perform an eBoost operation or a soft decoding operation as the second read operation, and
wherein the eBoost operation or the soft decoding operation comprises performing a plurality of read operations while changing a read voltage.

12. The memory system according to claim 10, wherein the processor comprises a retention characteristic improvement block configured to determine, if the second read operation fails, the deterioration characteristics by comparing the reference read voltages with the optimal read voltages used during the second read operation, select any one of the re-program operation or the reclaim operation in response to the determined deterioration characteristics and control the memory device.

13. The memory system according to claim 10, wherein the processor controls the memory device such that read voltages are set to the optimal read voltages and the second read operation is performed when a result of a second error correction operation on the second read data that is read during the second read operation indicates that no error bit is included or a minimum number of error bits are included.

14. The memory system according to claim 12,
wherein the retention characteristic improvement block detects read voltage difference values respectively corresponding to a plurality of programmed statuses by comparing the reference read voltages and the optimal read voltages, and
wherein the retention characteristic improvement block determines the deterioration characteristics to be low temperature data retention (LTDR) deterioration characteristics when the read voltage difference values of at least one or more most significant programmed statuses having high threshold voltages are greater than read voltage difference values of the other program programmed statuses among the plurality of programmed statuses.

15. The memory system according to claim 14,
wherein the retention characteristic improvement block controls the memory device to perform the re-program operation on the memory cells when the deterioration characteristics are the LTDR deterioration characteristics, and
wherein the retention characteristic improvement block controls the memory device to perform the reclaim operation on the memory cells when the deterioration characteristics are not the LTDR deterioration characteristics.

16. An operating method of a controller for controlling a memory device, the operating method comprising:
controlling the memory device to perform a first read operation to a memory region with a reference read voltage;
controlling the memory device to perform a second read operation to the memory region with an optimal read voltage when the first read operation fails due to an error of data read from the memory region; and
controlling the memory device to perform a re-program operation to the memory region when discrepancy between the reference read voltage and the optimal read voltage is greater for a first program status than for a second program status,
wherein the first program status is more significant program status than the second program status.

17. The operating method of claim 16, further comprising controlling the memory device to perform a read reclaim operation to the memory region when the discrepancy is not greater for the first program status than for the second program status.

* * * * *